(12) United States Patent
Lexa

(10) Patent No.: US 10,833,457 B2
(45) Date of Patent: Nov. 10, 2020

(54) DIRECTIONAL IN-LINE SUSPENDED PCB POWER SENSING COUPLER

(71) Applicant: Tegam, Inc., Geneva, OH (US)

(72) Inventor: Jefferson Lexa, Chesterland, OH (US)

( * ) Notice: Subject to any disclaimer, the term of this patent is extended or adjusted under 35 U.S.C. 154(b) by 17 days.

(21) Appl. No.: 16/458,285

(22) Filed: Jul. 1, 2019

(65) Prior Publication Data

US 2020/0076137 A1    Mar. 5, 2020

Related U.S. Application Data

(60) Provisional application No. 62/725,405, filed on Aug. 31, 2018.

(51) Int. Cl.

| | | |
|---|---|---|
| H01P 5/12 | (2006.01) | |
| H01P 5/16 | (2006.01) | |
| H01R 13/66 | (2006.01) | |
| H01R 12/71 | (2011.01) | |
| H01R 13/6464 | (2011.01) | |
| H01R 13/658 | (2011.01) | |
| H01R 12/70 | (2011.01) | |
| H01R 13/719 | (2011.01) | |

(52) U.S. Cl.
CPC ..... H01R 13/6683 (2013.01); H01R 12/7088 (2013.01); H01R 12/716 (2013.01); H01R 13/6464 (2013.01); H01R 13/658 (2013.01); H01R 13/6616 (2013.01); H01R 13/6625 (2013.01); H01R 13/6633 (2013.01); H01R 13/719 (2013.01)

(58) Field of Classification Search
CPC .. H01P 5/12; H01P 5/16; H01R 12/70; H01R 13/66; H01R 13/6616
See application file for complete search history.

(56) References Cited

U.S. PATENT DOCUMENTS

| | | | | |
|---|---|---|---|---|
| 4,801,903 A | * | 1/1989 | Mohr ................ | H01P 5/18 333/109 |
| 6,624,722 B2 | * | 9/2003 | Wang ................ | H01P 5/184 333/111 |
| 6,759,929 B2 | * | 7/2004 | Henningsson ........ | H01P 5/04 333/230 |
| 7,863,997 B1 | * | 1/2011 | Alton ................ | H01P 5/183 333/24 R |
| 8,228,136 B2 | * | 7/2012 | Subedi .............. | H01P 5/183 333/111 |
| 8,294,530 B2 | * | 10/2012 | Van Swearingen ... | H01P 1/2007 333/24 R |

* cited by examiner

*Primary Examiner* — Dean O Takaoka
(74) *Attorney, Agent, or Firm* — Brennan, Manna & Diamond, LLC

(57) ABSTRACT

An in-line suspended power sensor coupling configuration situated within a high frequency transmission line housing that allows forward, reverse, and sampling voltage elements to all be produced simultaneously on one double sided printed circuit board (PCB). The power sensor coupling allows for calibrated coupling responses across a much wider frequency range with a single PCB assembly, as opposed to the need to cover equivalently sized frequency ranges with multiple individually fabricated coupling element assemblies.

23 Claims, 15 Drawing Sheets

DIRECTIONAL IN-LINE SUSPENDED PCB POWER SENSING COUPLER

CROSS-REFERENCE TO RELATED APPLICATION

The present application claims priority to and the benefit of U.S. Provisional Application No. 62/725,405 filed on Aug. 31, 2018, which is incorporated herein by reference in its entirety.

FIELD OF THE INVENTION

The present invention pertains generally to an in-line suspended micro-strip power sensor coupling configuration for use within a high frequency transmission line housing that allows forward, reverse, and sampling voltage elements to all be produced simultaneously on one single double sided printed circuit board (PCB).

BACKGROUND OF THE INVENTION

Both discrete and printed circuit board power sensing couplers are known in the art, but oftentimes suffer from performance deviations inherently associated with building individual coupling element configurations that rely upon individual connection of stand-alone discrete electrical components (e.g., resistors, capacitors, and inductors). Said prior power sensing couplers are also relatively expensive to manufacture due to the high cost of fabricating and tuning the resulting individual coupling element assemblies.

Therefore, there is a long felt need in the art for a directional in-line power sensor coupling configuration for use within a high frequency transmission line housing that allows forward, reverse, and sampling voltage elements to all be produced simultaneously on one double sided PCB. There is also a need in the art for a device that allows for calibrated coupling responses across a much wider frequency range with a single PCB assembly, as opposed to the need to cover equivalently sized frequency ranges with multiple individually fabricated relatively narrowband coupling element assemblies.

Further, there is a long-felt need in the art for a directional in-line power sensing coupler that can be part of a large scale production and that affords increased repeatability of performance characteristics relying upon component parameters that can be tightly controlled in the fabrication process. Finally, there is a long felt need in the art for a directional in-line power sensing coupler that is relatively inexpensive to manufacture, safe, and easy to use.

SUMMARY OF THE INVENTION

The following presents a simplified summary in order to provide a basic understanding of some aspects of the disclosed innovation. This summary is not an extensive overview, and it is not intended to identify key/critical elements or to delineate the scope thereof. Its sole purpose is to present some concepts in a simplified form as a prelude to the more detailed description that is presented later.

The present invention includes a power sensing coupler for use with a high frequency, high power transmission line. The power sensing coupler comprises a base and a support connected to the base, the support component comprising a loop arm extending therefrom. The power sensing coupler further comprises a capacitance tuning tab and a terminating resistor connected to the support component via a connector inner conductor component. The power sensing coupler may further comprise a second connector inner conductor component, a second capacitance tuning tab, and a second terminating resistor. Both the second capacitance tuning tab and the second terminating resistor are connected to the support component via the second connector inner conductor component.

In an additional embodiment, a directional power sensing coupler comprises a base and a support component connected to the base. The directional power sensing coupler further comprises a perimeter edge plate and a printed circuit board (PCB) substrate attached thereto. The directional power sensing coupler further comprises a first coupling element comprising a conductor penetrating the PCB substrate, a loop area formed within the PCB substrate, a capacitive tuning tab, and a terminating resistor. The capacitive tuning tab and the terminating resistor are both in electrical communication with the conductor. The directional power sensing coupler may further comprise a second coupling element, and a sampling coupling element. Each of the coupling elements may be formed simultaneously upon attaching the PCB substrate directly to the base.

In an additional embodiment, a directional power sensing coupler comprises a base and a support component connected to the base. The directional power sensing coupler further comprises a PCB substrate and a gap comprising a loop area separating the PCB substrate from the support component. As such, the PCB substrate is suspended below the base with the gap component in between. The directional power sensing coupler further comprises a forward coupling element comprising a conductor penetrating the gap and the PCB substrate. The forward coupling component further comprises a capacitive tuning tab and a terminating resister, both in electrical communication with the conductor. The directional power sensing coupler may further comprise a reverse coupling element and a sampling coupling element.

In all embodiments, a method of using a power sensor coupler provides a user easy access to a tuning capability for a broadband directivity performance of the power sensor through a simple modification of a capacitive tuning tab. The method also is scalable in both frequency and coupling characteristics.

To the accomplishment of the foregoing and related ends, certain illustrative aspects of the disclosed innovation are described herein in connection with the following description and the annexed drawings. These aspects are indicative, however, of but a few of the various ways in which the principles disclosed herein can be employed and is intended to include all such aspects and their equivalents. Other advantages and novel features will become apparent from the following detailed description when considered in conjunction with the drawings.

BRIEF DESCRIPTION OF THE FIGURES

While the specification concludes with claims particularly pointing out and distinctly claiming the present invention, it is believed that the present invention will be better understood from the following description in conjunction with the accompanying Figures, in which like reference numerals identify like elements, and wherein:

DETAILED DESCRIPTION

In the following detailed description of the preferred embodiment, reference is made to the accompanying drawings that form a part hereof, and in which is shown by way of illustration, and not by way of limitation, a specific preferred embodiment in which the invention may be practiced. It is to be understood that other embodiments may be utilized and that changes may be made without departing from the spirit and scope of the present invention.

The present invention describes a power sensing coupler for use with a high frequency, high power transmission line that allows for forward, reverse, and sampling voltage elements to be produced simultaneously on one double sided printed circuit board (PCB). This is advantageous as it is economical for large scale production and increased repeatability of performance characteristics.

All coupling elements (forward, reverse, and sampling) rely on both the distributive nature of the housing structure to which the PCB is attached as well as the printed circuit layout, both of which can be controlled exceptionally well in structural design and fabrication tolerances. All of the coupling elements may also be formed simultaneously when the PCB is attached to the housing in a single assembly step and require minimal coupling value and directivity optimization tuning thereafter due to the repeatable nature of the fabrication process. The coupling elements formed in this manner are generally more broadband and continuous in nature versus frequency due to their relatively small distributed sizes than existing relatively narrowband approaches where the elements are formed and fabricated individually from discrete components.

The design and implementation of the power sensing coupler still fundamentally remains an inductive loop sampling device, and therefore the induced voltage output from each coupling element is dependent upon the frequency applied to it. The coupling response characteristic is substantially linear in response to logarithmic frequency with an approximately 20 dB/decade slope and will normally require some type of equalization circuit to present a more controlled dynamic range input to downstream detection circuitry.

Figure 1:
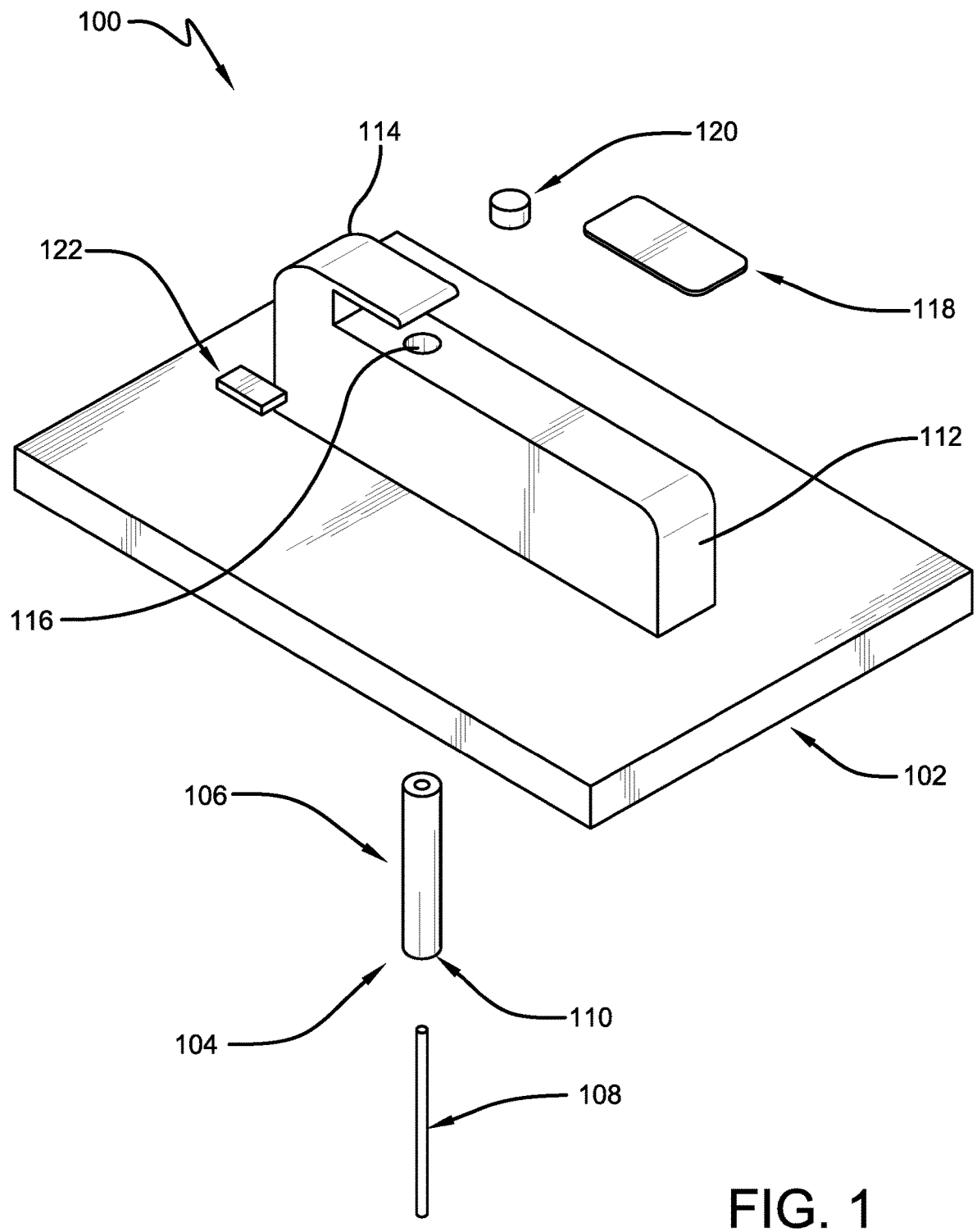
FIG. 1 illustrates a partially exploded perspective view of one potential embodiment of a power sensing coupler of the present invention.
Figure 2:
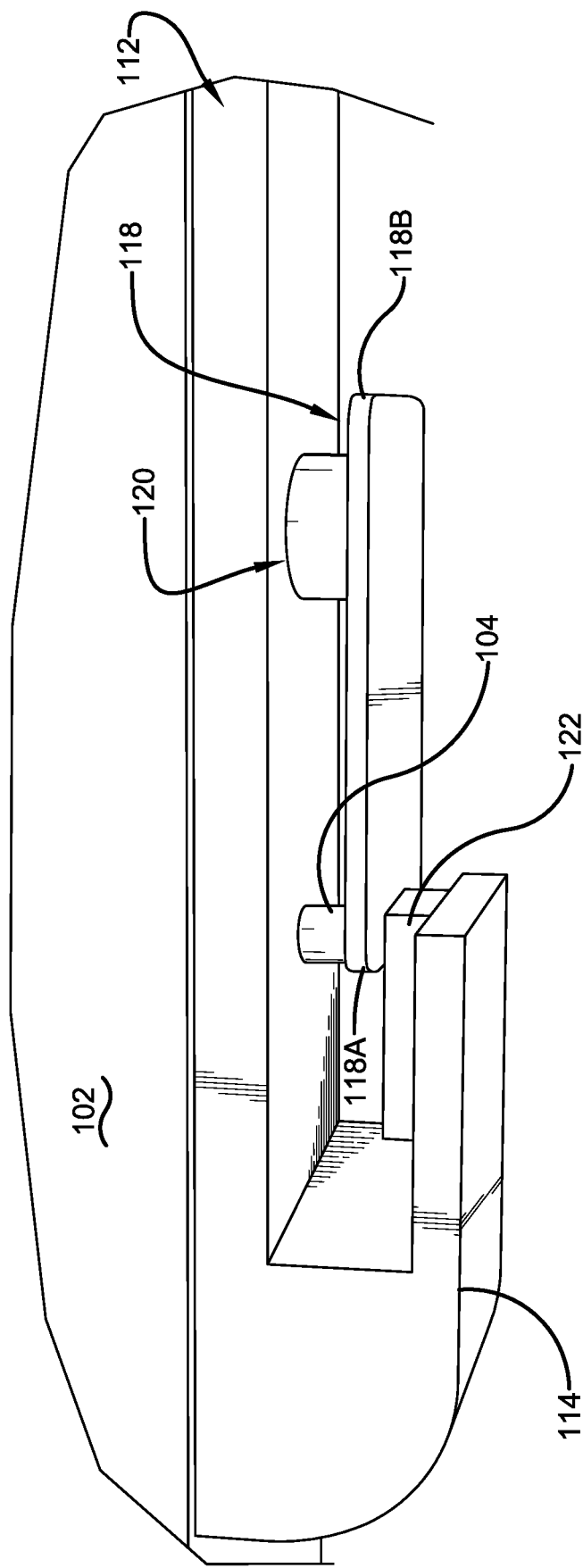
FIG. 2 illustrates a cut away side view a portion of the power sensing coupler of the present invention.
Figure 3:
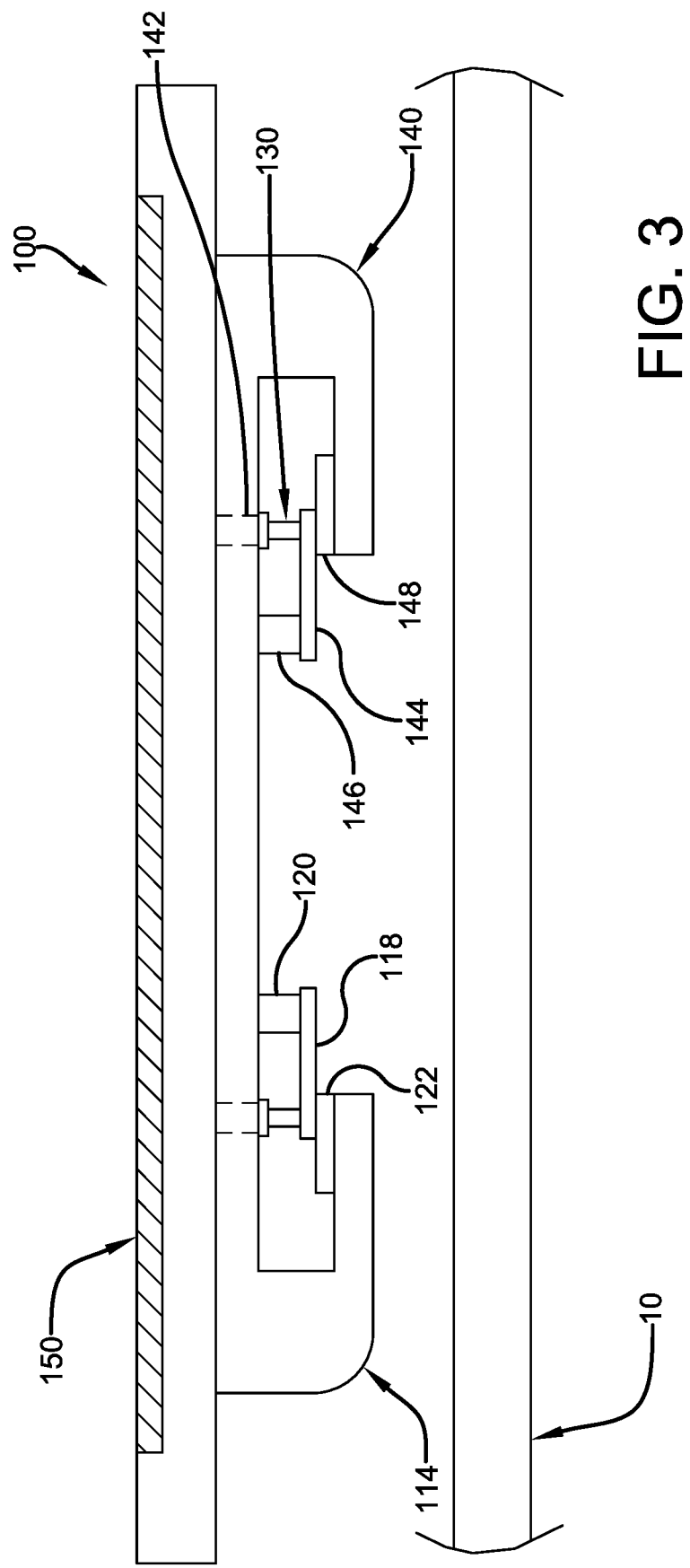
FIG. 3 illustrates a side view of the power sensing coupler configuration of the present invention.
Figure 4:
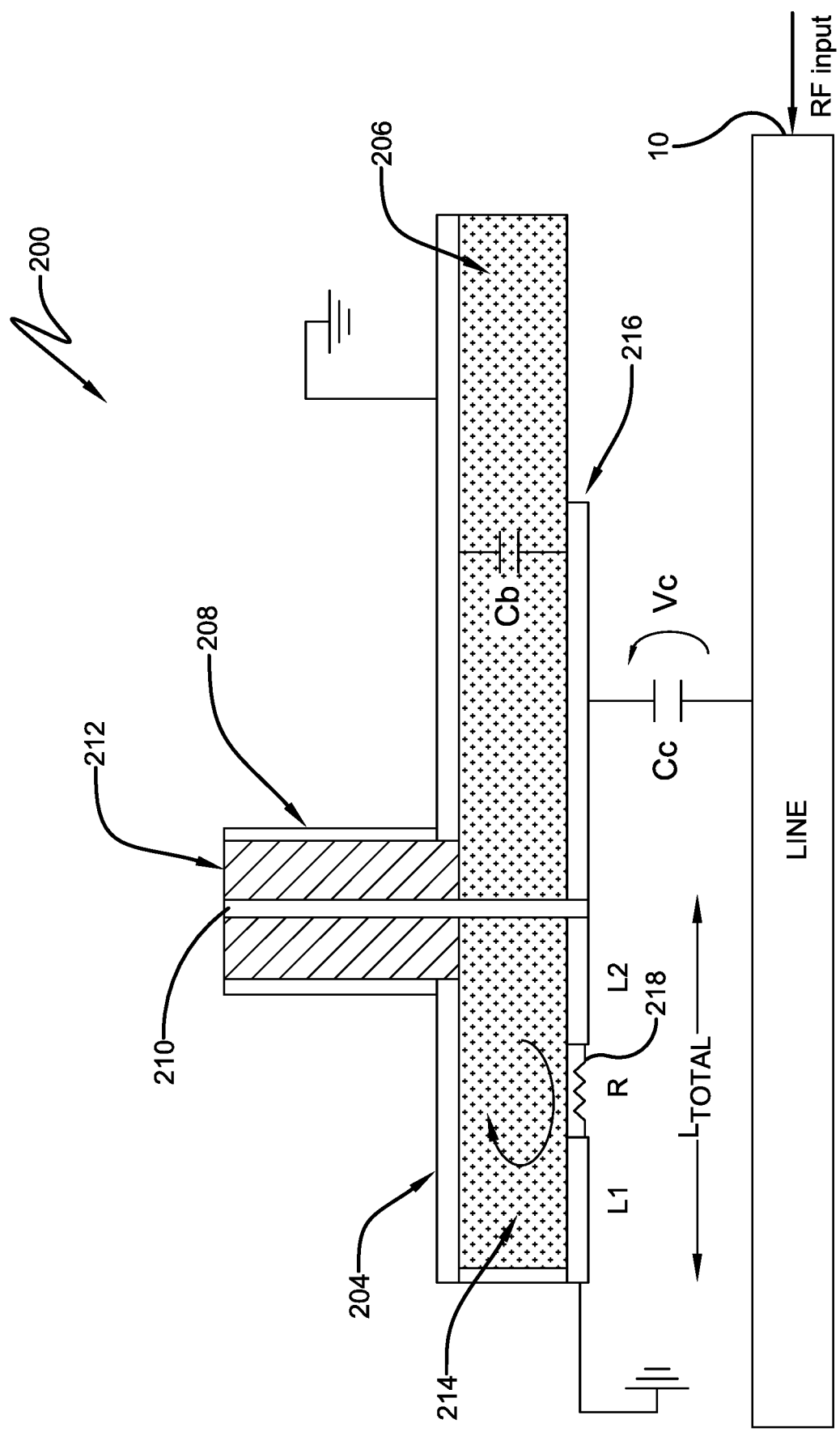
FIG. 4 illustrates a schematic diagram of one potential embodiment of a directional power sensing coupler of the present invention.
Figure 5:
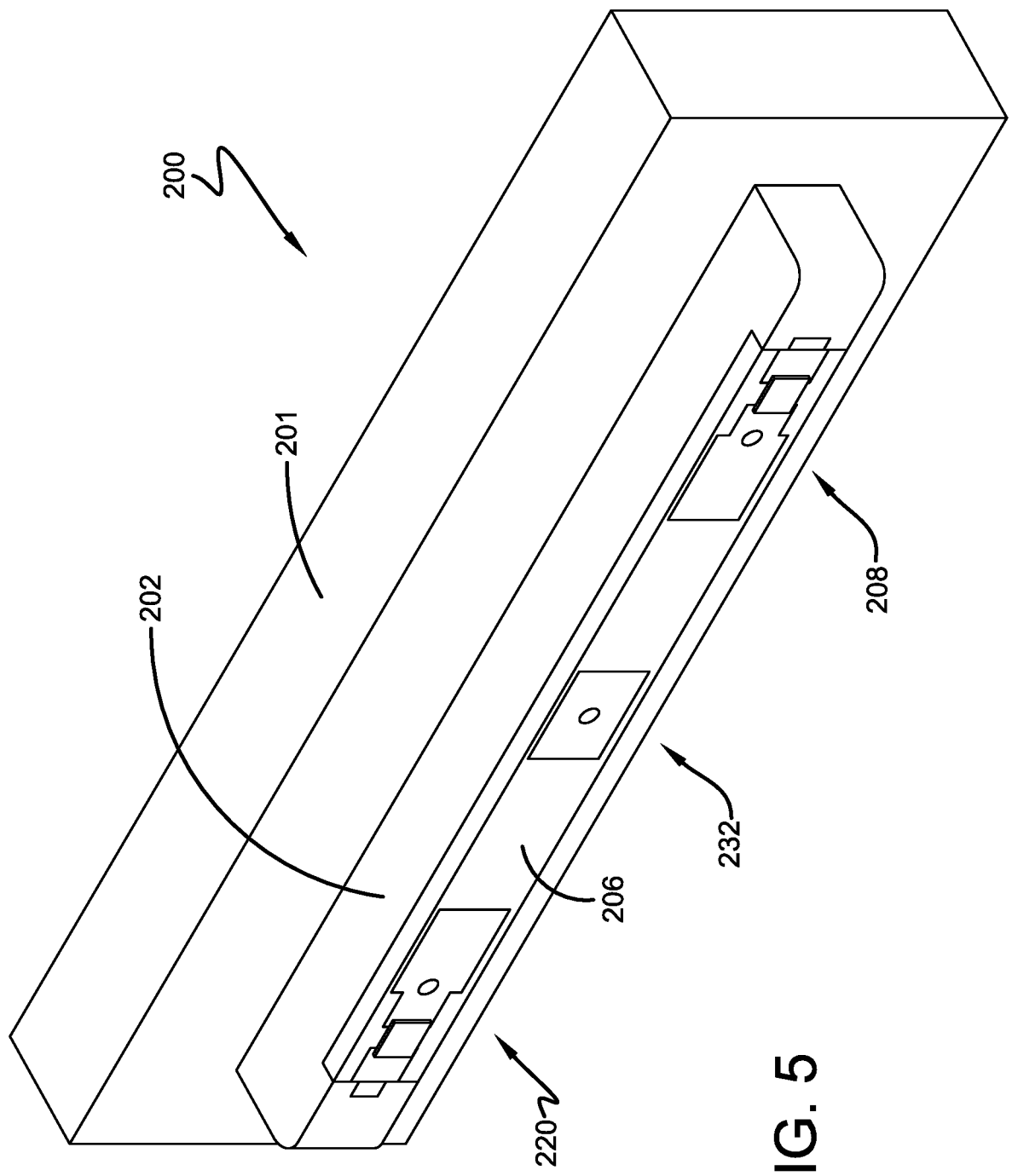
FIG. 5 illustrates a perspective view of the directional power sensing coupler of the present invention.
Figure 6:
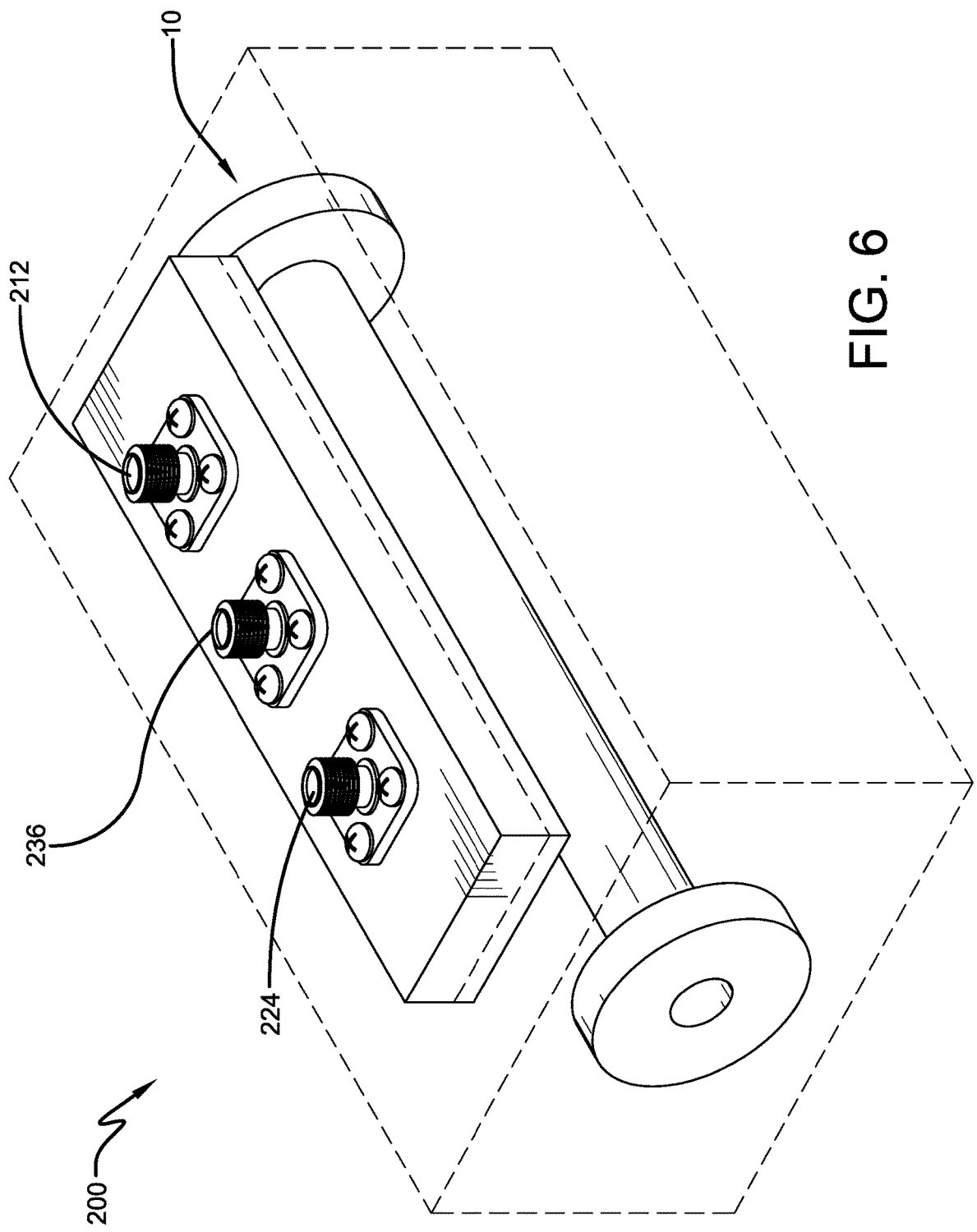
FIG. 6 illustrates a perspective view of a first coupling component, a second coupling component, and a third coupling component of the directional power sensing coupler of the present invention.
Figure 7:
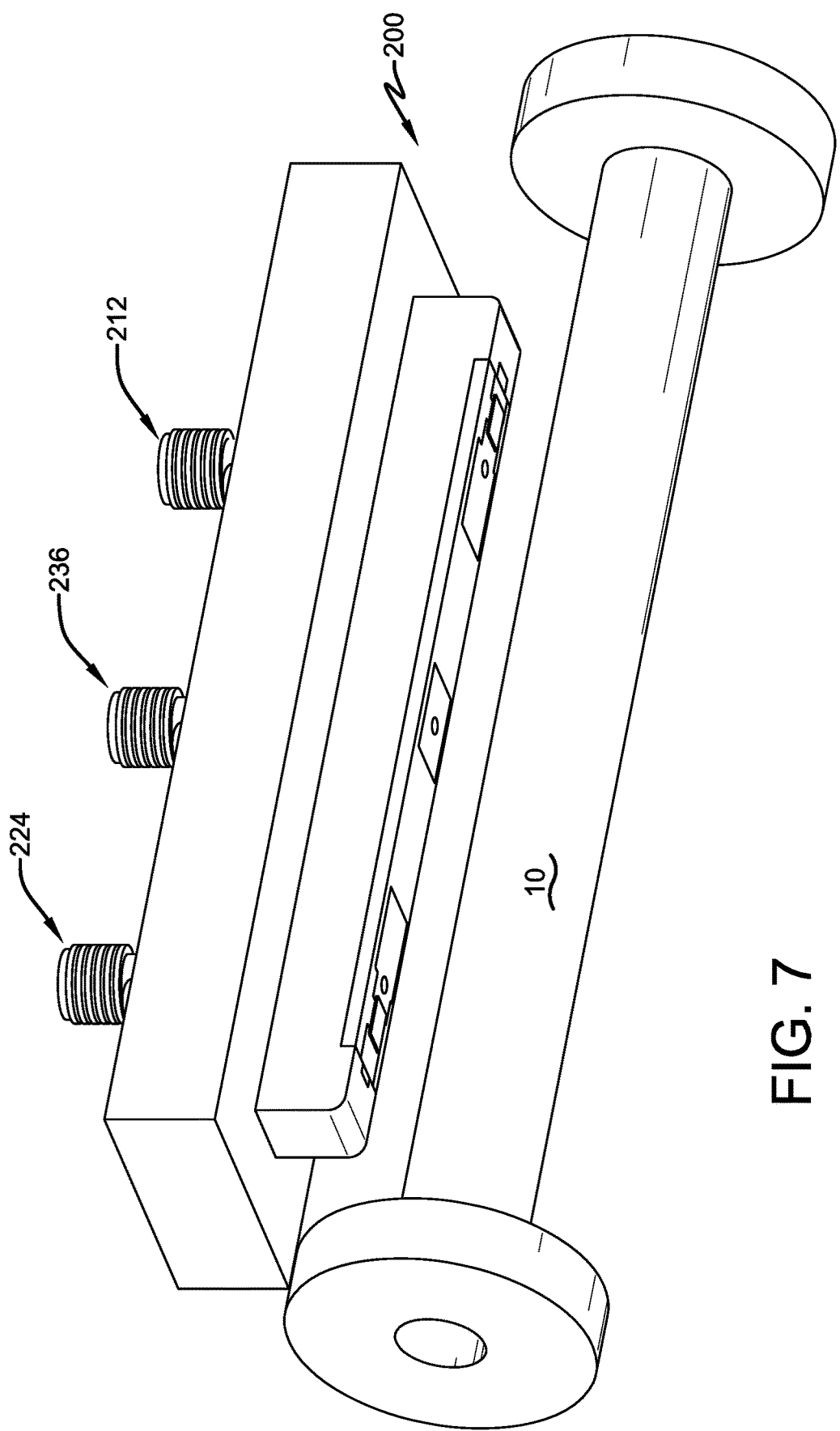
FIG. 7 illustrates a perspective view of the directional power sensing coupler coupled to a transmission line of the present invention.

Referring initially to the drawings, FIGS. 1 and 2 illustrate one embodiment of a power sensing coupler 100 of the present invention. The power sensing coupler 100 may be a directional power sensing coupler. The power sensing coupler 100 comprises a base 102, a support component 112, and a connector inner conductor component 104. The base 102 is electrically conductive. The support component 112 is attached or otherwise connected to or integrated with the base 102. As illustrated in FIG. 3, the power sensing coupler 100 further comprises a PCB 150 attached to or integrated into the base 102. The power sensing coupler 100 further comprises a loop component 114, a tab component 118, and a terminating resistor 122. The loop component 114 extends from one end of the support component 112. The loop component 114 is generally a loop arm that functions as an inductive coupling loop. The tab component 118 is generally a capacitive tuning tab that functions as a capacitive coupling voltage element.

The connector inner conductor component 104 comprises a sleeve 106, a conductor 108, and an output 110. The sleeve 106 is typically an insulating or air sleeve, or the like. The conductor 108 is encased by the sleeve 106, both of which penetrate the base 102 and the support component 112. The conductor 108 terminates in the output 110 which is generally a coaxial output.

The tab component 118 is connected at one end 118A to the support component 112 by the connector inner conductor component 104 and the terminating resistor 122. The terminating resistor 122 is attached to an inner surface of the loop component 114. The tab component 118 is attached at the one end 118A to the terminating resistor 122 via a portion of the conductor 108 that extends through a first connector inner conductor component connection 116, or through hole, of the support component 112. As such, the tab component 118 is connected to the loop component 114 by the terminating resistor 122. The tab component 118 is non-conductively attached at an opposing end 118B to the support component 112 via a support element 120. The support element 120 is typically a nonconductive support puck, or similar spacing device. The power sensing coupler 100 thus functions essentially as a voltage pickup plate and current loop in a single structure. As such, the tab component 118 is essentially independent of the loop component 114. This allows the tab component 118 to pick up a capacitive field and the loop component 114 to pick up a magnetic field with minimal cross field contamination between them.

As illustrated in FIG. 3, the power sensing coupler 100 may further comprise a second connector inner conductor component 130 for engaging the support component 112 at an end opposite the first connector inner conductor component 104. The second connector inner conductor component 130 similarly comprises a second sleeve, a second conductor, and a second coaxial output. The support component 112 comprises a second connector inner conductor component connection 142, or through hole. The power sensing coupler 100 further comprises a second loop component 140, a second tab component 144, and a second terminating resistor 148. The second loop component 140 extends from an end of the support component 112 substantially opposite of the first loop component 114. The second terminating resistor 148 is attached to an inner surface of the second loop component 140. The second tab component 144 is attached at one end to the second terminating resistor 148 via a portion of the second conductor that extends through the second coupling component connection, or through hole, of the support component 112. The second tab component 144 is attached at the other end to the support component 112 via a second tab support element 146 such as a nonconductive support puck. As such, the second tab component 144 is connected to the support component 112 by the second inner conductor component 130 and to the second loop component 140 by the second terminating resistor 148.

FIGS. 4-7 illustrate another embodiment of a directional power sensing coupler 200 utilizing a PCB in a micro-strip configuration to economically realize the individual coupling elements in conjunction with a base 201. The directional power sensing coupler 200 comprises the base 201, a support component 202 connected to the base 201, a perimeter edge plate 204, and a printed circuit board (PCB) substrate 206. The PCB substrate 206 is generally a double-sided printed circuit board with a topology designed to simultaneously provide an inductive coupling loop and capacitive coupling voltage tab upon which the respective electrical parameters are designed to be relatively independent of each other and easily balanced to produce broadband directivity throughout a desired frequency range. The perimeter edge plate 204 separates the printed circuit board (PCB) substrate 206 from the support component 202 and the base 201. The PCB substrate 206 is attached to the perimeter edge plate 204.

The directional power sensor 200 further comprises a first coupling component 208. The first coupling component 208, or forward coupling component, comprises a conductor 210 that penetrates the PCB substrate 206, and a first loop area 214 formed within the PCB substrate 206. The conductor 210 is typically encased in an insulated or air sleeve with one end of the conductor 210 terminating in a first coaxial output 212. The other end of the conductor 210 penetrates and extends through the perimeter edge plate 204 and the PCB substrate 206.

The first coupling component 208 further comprises a capacitive tuning tab 216 and a terminating resistor 218. The terminating resistor 218 is attached to a bottom side of the PCB substrate 206 and is in electrical communication with the first conductor 210. The first loop area 214 is generated within the PCB substrate 206 located between the perimeter edge plate 204, the terminating resistor 218, and the first conductor 210. The capacitive tuning tab 216 is attached to a bottom side of the PCB substrate 206 and is in electrical communication with the first conductor 210 proximal to the terminating resistor 218. The capacitive tuning tab 216 is also capacitively coupled to a high frequency transmission line 10 which may or may not be encased within a housing.

The directional power sensor 200 may further comprise a second coupling component 220. The second coupling component 220, or reverse coupling component, comprises a conductor (not shown) that penetrates the PCB substrate 206, and a second loop area (not shown) formed within the PCB substrate 206. The conductor is typically encased in a sleeve with one end terminating in a second coaxial output 224, and the other end penetrating and extending through the perimeter edge plate 204 and the PCB substrate 206.

The second coupling component 220 further comprises a second capacitive tuning tab (not shown) and a second terminating resistor (not shown). The second terminating resistor is attached to a bottom side of the PCB substrate 206 and is in electrical communication with the second conductor. The second loop area is generated within the PCB substrate 206 located between the perimeter edge plate 204, the second terminating resistor, and the second conductor. The second capacitive tuning tab is attached to a bottom side of the PCB substrate 206 and is in electrical communication with the second conductor proximal to the second terminating resistor. The second capacitive tuning tab is also capacitively coupled to the high frequency transmission line 10 which may or may not be encased within the housing. The second coupling component 220 is oriented substantially opposite of the first coupling component 208 in a substantially mirror image type arrangement.

The directional power sensor 200 may further comprise a sampling coupling component 232 located along the PCB substrate 206. The sampling coupling component 232 comprises a conductor (not shown) that penetrates the PCB substrate 206 at one end and that terminates in a third coaxial output 236 at the other end. The conductor is encased in a sleeve with one end terminating in the output 236, and the other end penetrating and extending through the perimeter edge plate 204 and the PCB substrate 206.

The sampling coupling component 232 further comprises a third capacitive tuning tab (not shown) and a conductive trace (not shown). The conductive trace is attached to a bottom side of the PCB substrate 206 and is in electrical communication with the third conductor. The third capacitive tuning tab is attached to a bottom side of the PCB substrate 206 and connects to the third conductor on the opposite side of the conductive trace. The third capacitive tuning tab is also capacitively coupled to the high frequency transmission line 10 which may or may not be encased within the housing. The sampling coupling component 232 is oriented in between the first coupling component 208 and the second coupling component 220.

FIGS. 8-14 illustrate another embodiment of a directional power sensing coupler 300 utilizing a suspended micro-strip double sided PCB to economically realize individual coupling elements in conjunction with a base for use with a transmission line 10. The directional power sensing coupler 300 comprises a base 302, a support component 301 connected to the base 302, a gap component 304, and a PCB substrate 312. The PCB substrate 312 is generally a suspended double-sided printed circuit board with a topology as discussed supra. The gap component 304 separates the PCB substrate 312 from the support component 301. The gap component 304 comprises a perimeter 306, and a first loop area 308 located at one end of the gap component 304. The gap component 304 may further comprise a second loop area 310 located at an opposite end of the gap component 304 from the first loop area 308. The gap component 304 enhances coupling and shielding of the first and second loop areas 308, 310.

The PCB substrate 312 comprises an inner surface 314 adjacent to the gap component 304 and an outer surface 316. The directional power sensing coupler 300 further comprises a shield layer 318 located on the outer surface 316 of the PCB substrate 312 at either end of the gap component 304 along the first and second loop areas 308, 310. The shield layer 318 allows any internal terminating resistors to be shielded from the E field of the transmission line 10 resulting in greater directivity and the reduced Cb (capacitance formed from the tuning stub to the base of the housing carrier plate) resulting from the gap component 304, allowing for realization of greater coupling values.

Figure 8A:
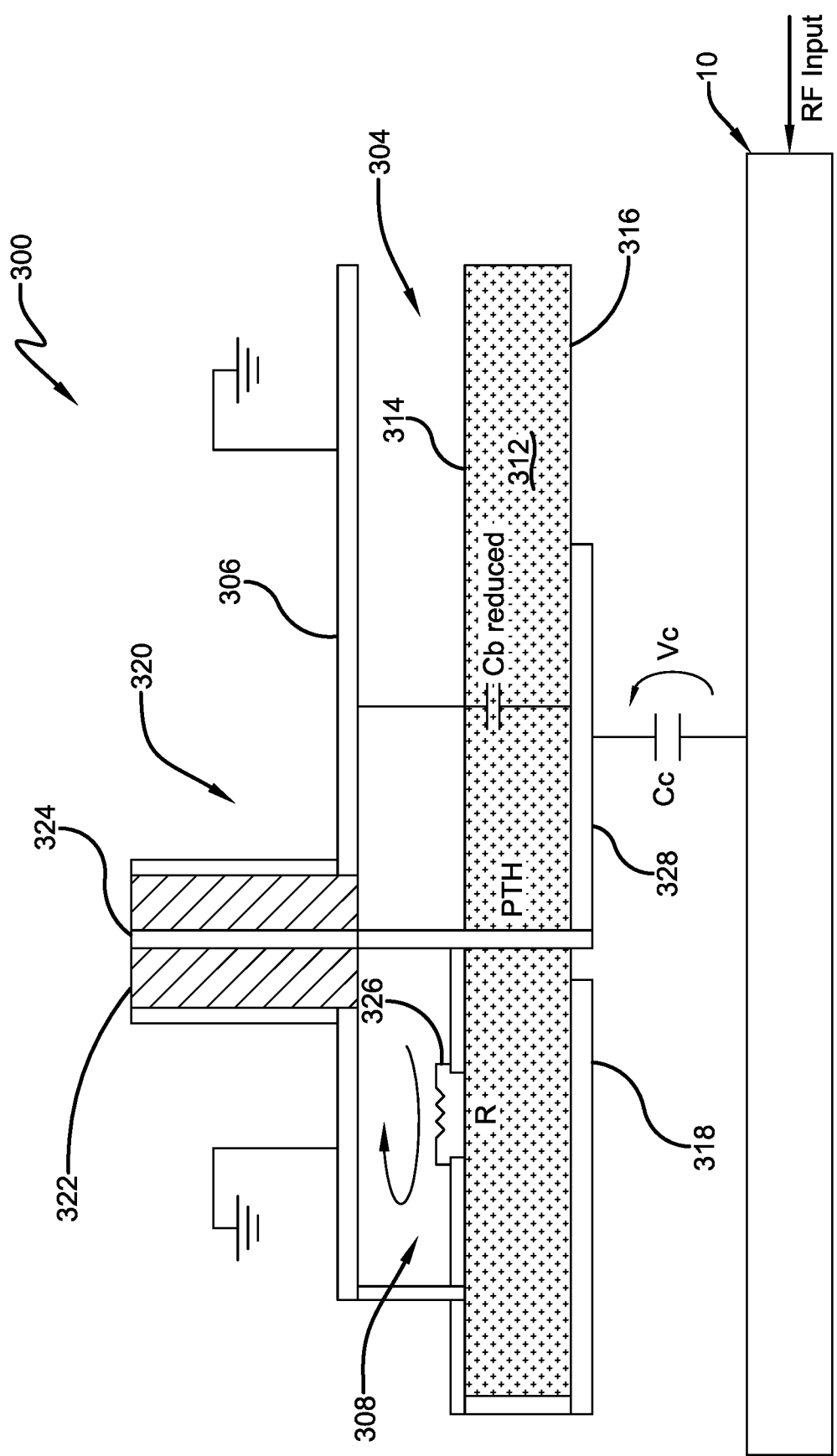
FIG. 8A illustrates a schematic diagram of one embodiment of a directional power sensing coupler comprising a forward coupling component of the present invention.

As illustrated in FIG. 8A, the directional power sensing coupler 300 further comprises a forward coupling component 320. The forward coupling component 320 comprises a conductor 324. The conductor 324 is typically encased in an insulated or air sleeve with one end terminating in a coaxial output 322, and the other end penetrating and extending through the gap component 304 and the PCB substrate 312.

The forward coupling component 320 further comprises a capacitive tuning tab 328 and a terminating resistor 326. The terminating resistor 326 is attached to the inner surface 314 of the PCB substrate 312 and is in electrical communication with the first conductor 324. The first loop area 308 is generated within the gap component 304 located between the perimeter 306, the terminating resistor 326, and the first conductor 324. The capacitive tuning tab 328 is attached to the outer surface 316 of the PCB substrate 312 and is in electrical communication with the first conductor 324. The capacitive tuning tab 328 is also capacitively coupled to a high frequency transmission line 10 which may or may not be encased within a housing. The shield layer 318 is located between the loop area 308 the terminating resistor 326, and the transmission line 10.

Figure 8B:
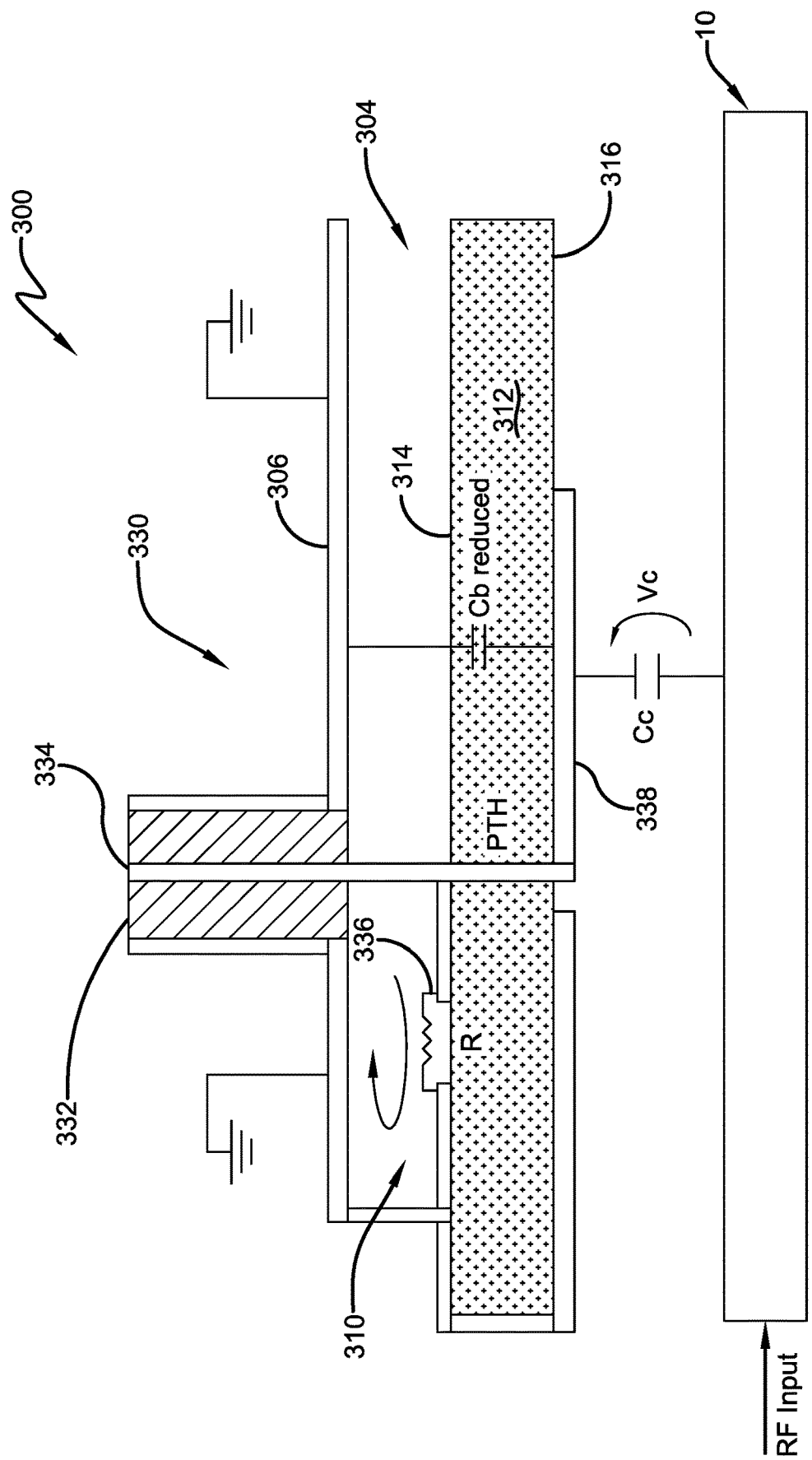
FIG. 8B illustrates a schematic diagram of the directional power sensing coupler comprising a reverse coupling component of the present invention.
Figure 9:
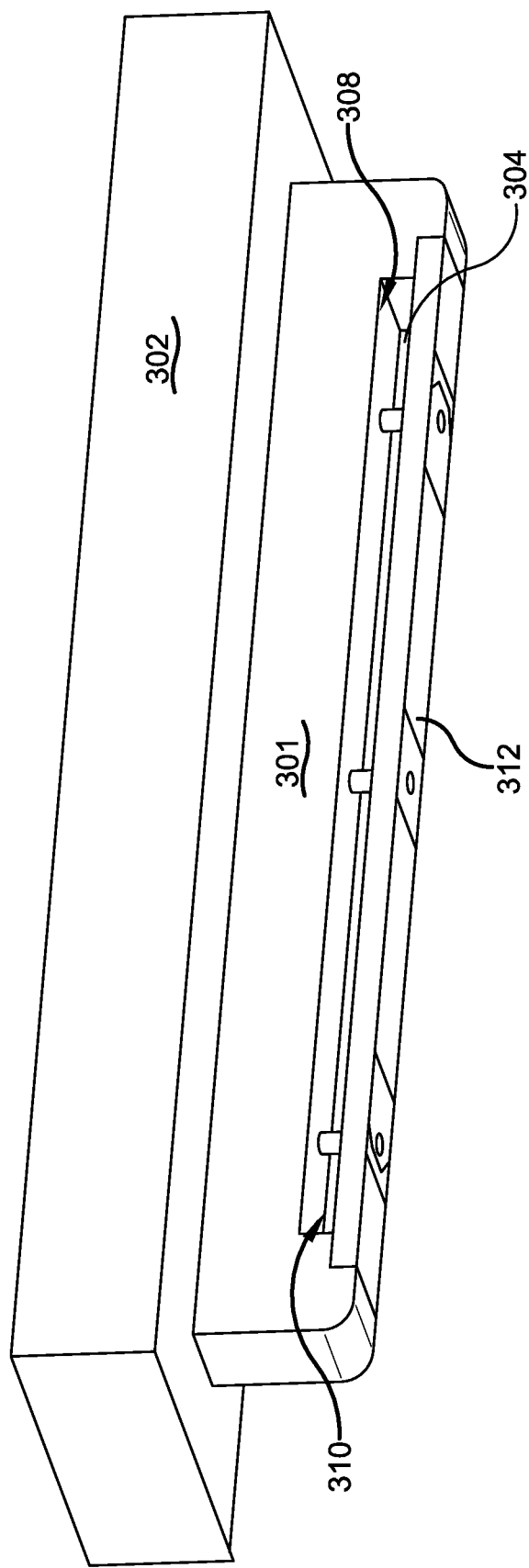
FIG. 9 illustrates a perspective view of the directional power sensing coupler of the present invention.
Figure 10:
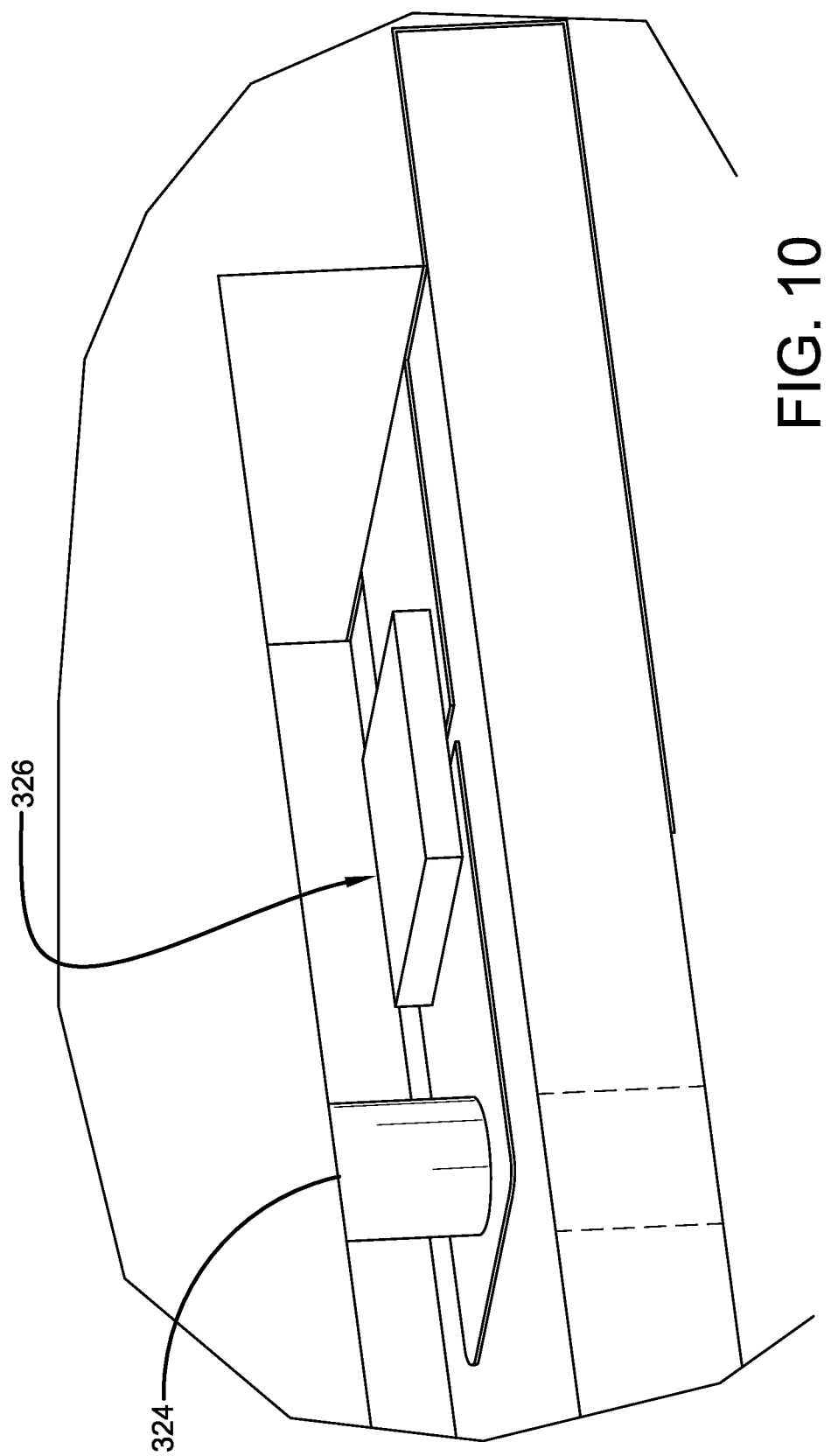
FIG. 10 illustrates a cut away view of a conductor and a resistor of the reverse coupling component of the directional power sensing coupler of the present invention.
Figure 11:
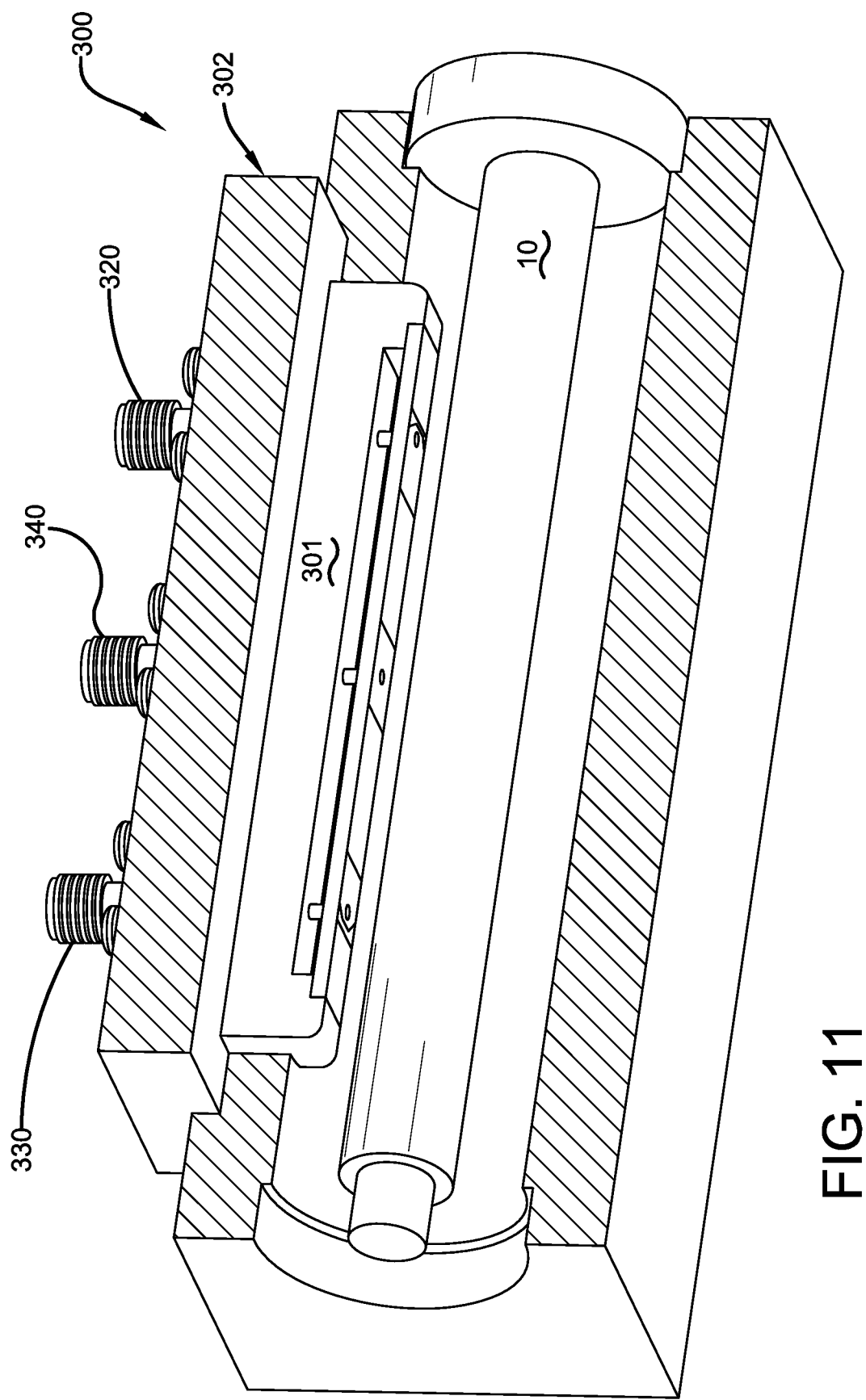
FIG. 11 illustrates a perspective view of the directional power sensing coupler coupled to a transmission line of the present invention.
Figure 12:
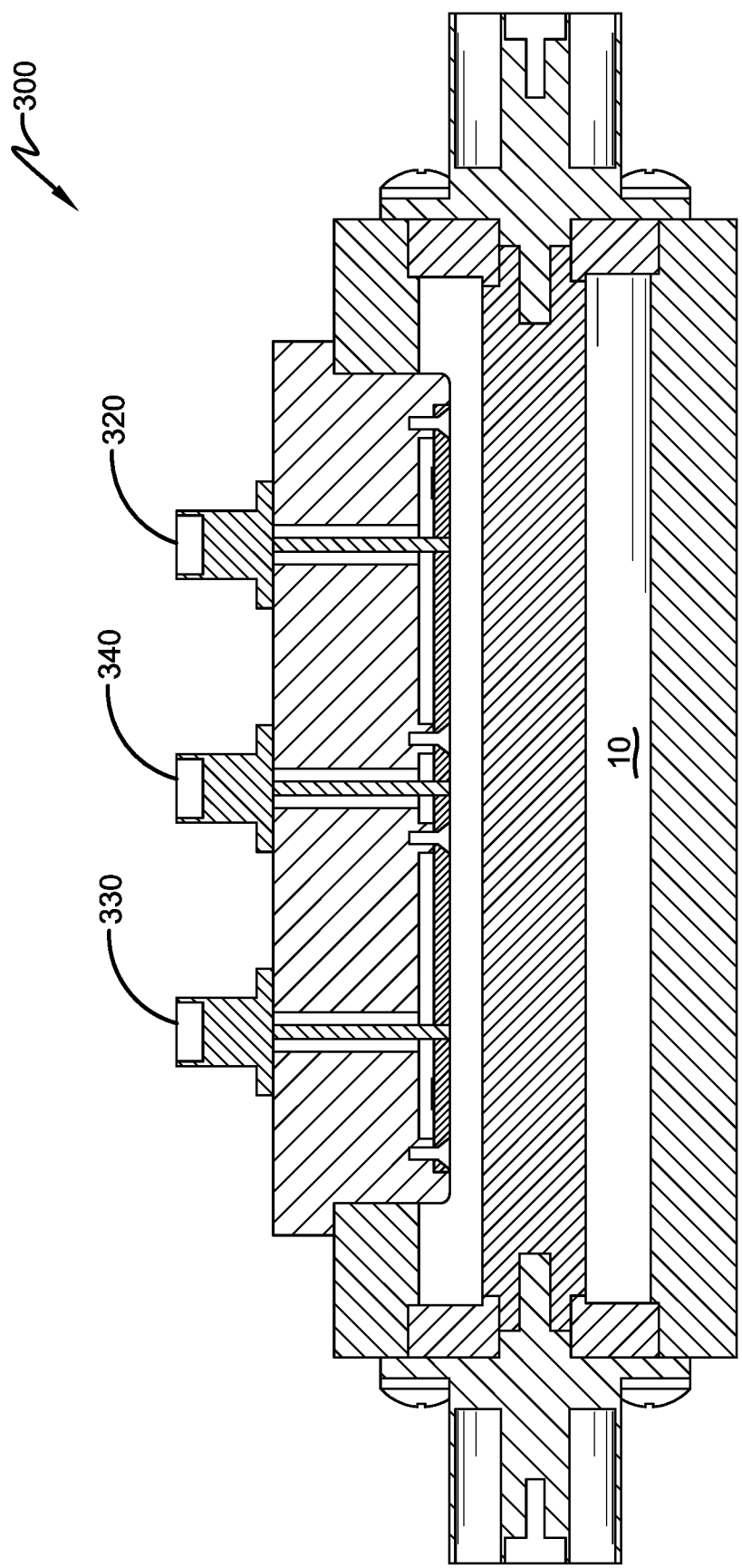
FIG. 12 illustrates a cross sectional view of the directional power sensing coupler of the present invention.
Figure 13:
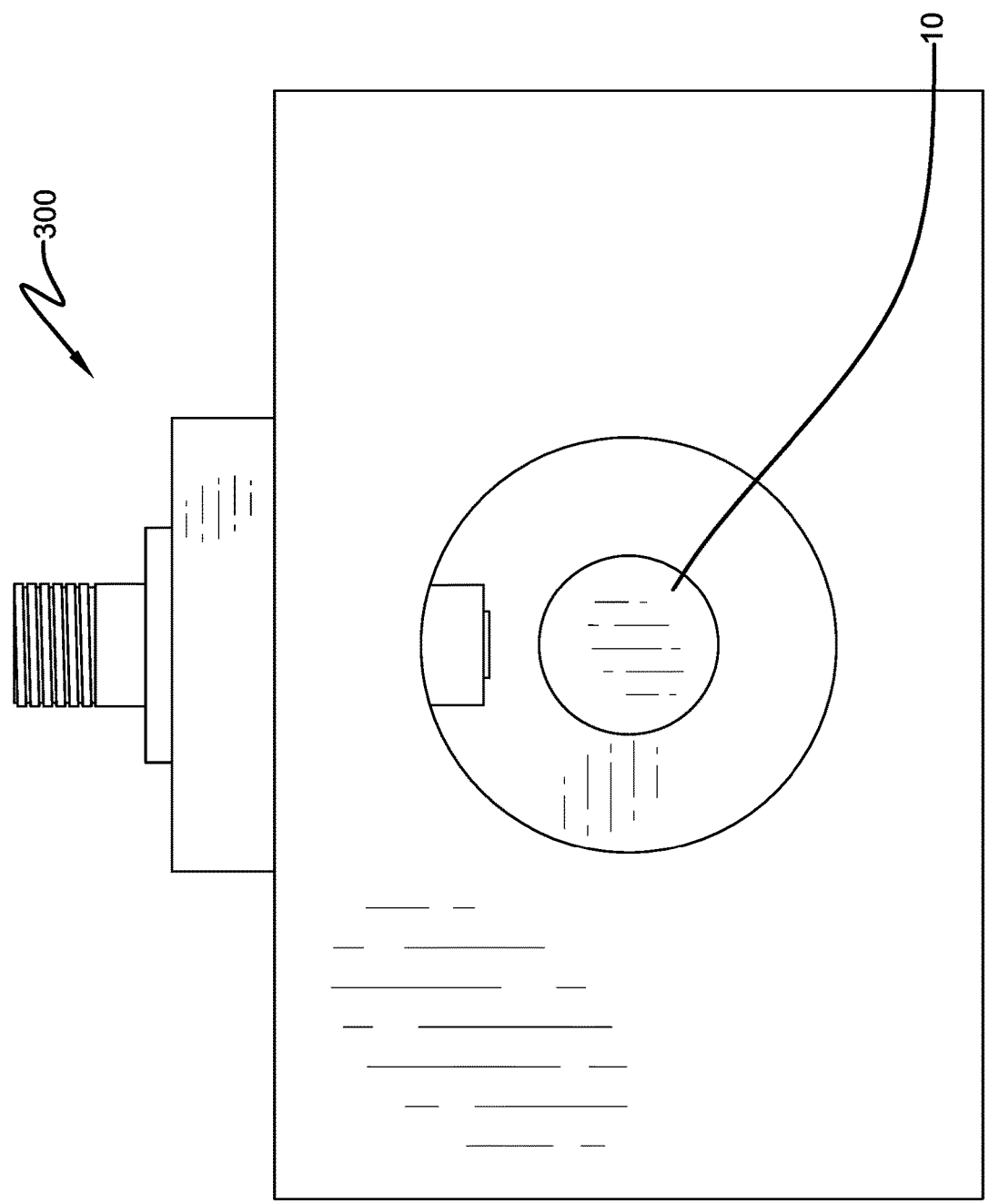
FIG. 13 illustrates an end view of the directional power sensing coupler coupled to the transmission line of the present invention.

As illustrated in FIG. 8B, the directional power sensing coupler 300 may further comprise a reverse coupling component 330. The reverse coupling component 330 comprises a second conductor 334. The second conductor 334 is encased in a sleeve with one end terminating in a second coaxial output 332, and the other end penetrating and extending through the gap component 304 and the PCB substrate 312. The reverse coupling component 330 is generally located along the PCB substrate 312 substantially opposite of the forward coupling component 320 in a substantially mirror image type arrangement.

The reverse coupling component 330 further comprises a second capacitive tuning tab 338 and a second terminating resistor 336. The second terminating resistor 336 is attached to the inner surface 314 of the PCB substrate 312 and is in electrical communication with the second conductor 334. The second loop area 310 is generated within the gap component 304 located between the perimeter 306, the second terminating resistor 336, and the second conductor 334. The second capacitive tuning tab 338 is attached to the outer surface 316 of the PCB substrate 312 and connects to the second conductor 334. The second capacitive tuning tab 338 is also capacitively coupled to the high frequency transmission line 10 which may or may not be encased within the housing.

Figure 14:
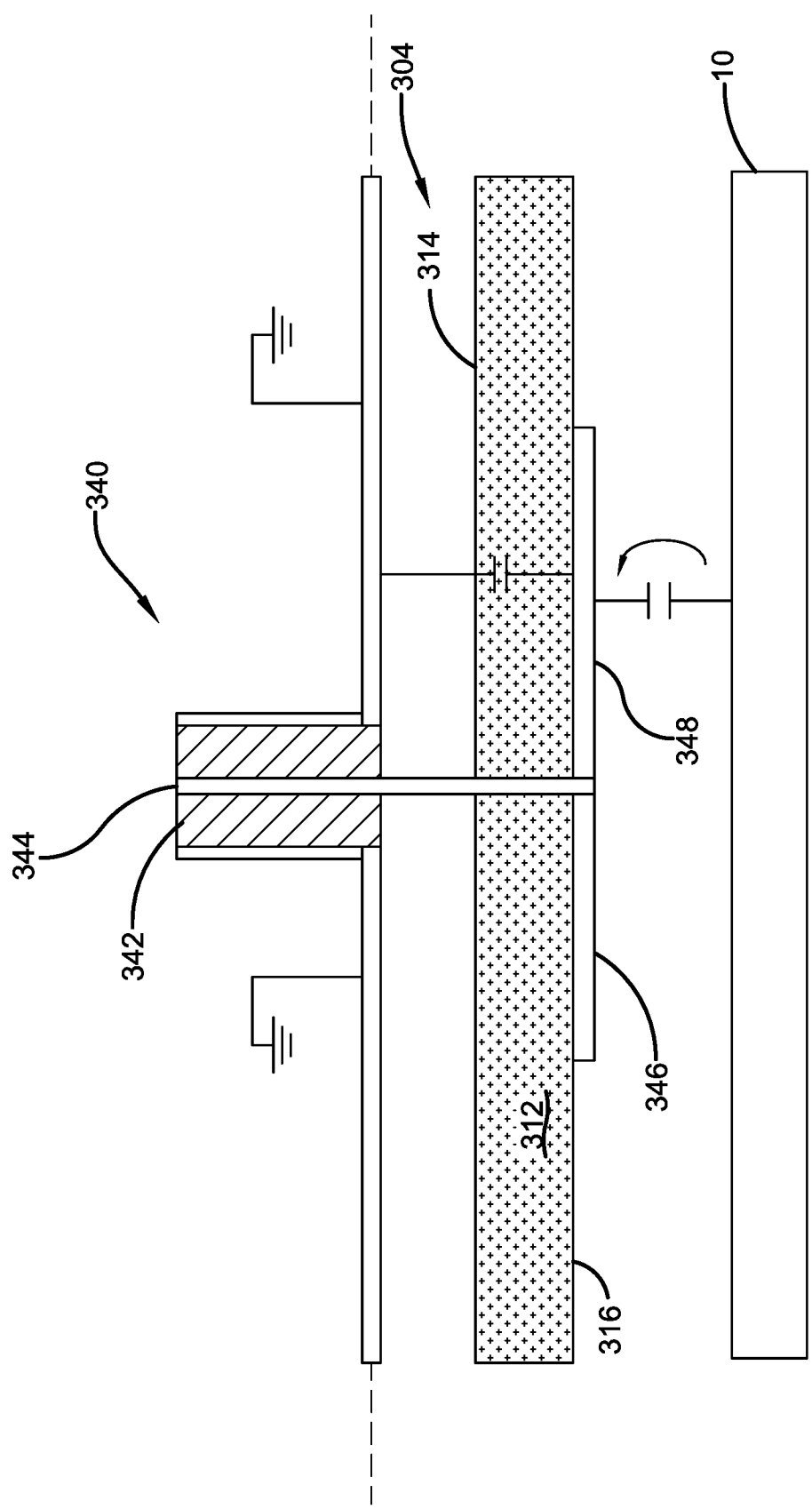
FIG. 14 illustrates a schematic diagram of a sampling component of the directional power sensing coupler of the present invention.

As illustrated in FIG. 14, the directional power sensing coupler 300 may further comprise a sampling coupling component 340. The sampling coupling component 340 is generally located along the PCB substrate 312 substantially in between the forward coupling component 320 and the reverse coupling component 330. The sampling coupling component 340 comprises a sampling component conductor 344. The sampling component conductor 344 is typically encased in an insulated or air sleeve with one end terminating in a third coaxial output 342, and the other end penetrating and extending through the perimeter edge plate 306, the gap component 304, and the PCB substrate 312.

The sampling coupling component 340 further comprises a third capacitive tuning tab 348 and a conductive trace 346. The conductive trace 346 is attached to the outer surface 316 of the PCB substrate 312 and is in electrical communication with the sampling component conductor 344. The third capacitive tuning tab 348 is attached to the outer surface 316 of the PCB substrate 312 and is in electrical communication with the sampling component conductor 344 on the side opposite the conductive trace 346. The third capacitive tuning tab 348 is also capacitively coupled to the high frequency transmission line 10 which may or may not be encased within the housing.

The directional in-line suspended micro-strip power sensor coupling configuration allows the forward, reverse, and sampling voltage coupling elements to all be produced on one double sided PCB for economic large scale production purposes. The forward, reverse, and sampling coupling elements 320, 330, 340 are all manufacturable substantially simultaneously in conjunction with the PCB substrate 312 and the support component 301. The directional power sensing coupler 300 also employs a configuration that utilizes the PCB traces to provide inherent isolation and shielding for an embedded wideband terminating match resistor that minimizes mismatch power sensing error over a broadband frequency range. Additionally, the configuration utilizes the grounded housing in conjunction with traces on the PCB to inherently form the loop length while simultaneously providing electric field shielding of the coupling loop from the main line minimizing the distributed capacitance associated with the loop.

The directional in-line suspended power sensor coupling configuration utilizes the printed circuit board precision thickness together with the machined gap of the base located within the housing to produce the suspended height of the PCB. These dimensions determine the coupling loop inductive and capacitive voltage tab reactance, thereby providing consistent and repeatable performance from unit to unit because both the PCB thickness and machined gap can be controlled with very precise tolerances. Therefore, the directional power sensing coupler 300 is manufacturable so that a thickness of the PCB substrate 312 and a gap distance produce a consistent and repeatable coupling value. Additionally, the configuration utilizes a coaxial line from the coupled port to the internal coupling loop and capacitive voltage tab and is contained within the housing structure allowing precise characteristic impedance attributes while simultaneously forming part of the coupling loop structure for easy attachment by means of a plated through hole. Providing precise characteristic impedance capability while making minimal distance attachment to the coupling loop is essential to maintaining the broadband characteristics of the terminating match resistor.

The directional in-line suspended power sensor coupling configuration also utilizes the grounded housing in conjunction with traces on the PCB to provide direct minimal distance access to ground for the terminating match resistor thereby allowing good heat sinking capability for high power operation, and is scalable in frequency and coupling characteristics and applicable to mate with all standard geometric sizes of through line coaxial assembly configurations. The base 302, the support component 301, and the PCB substrate 312 traces of the directional power sensing coupler 300 provide a direct heat sink path to a ground thereby allowing the use of higher power termination resistors to enhance power handling coupling capability from the main transmission line 10.

Another embodiment of the present invention describes a method of providing easy access tuning capability for the broadband directivity performance of a power sensing element by altering the length of a capacitive tab connected to a coupling loop by means of a plated through hole connection on the opposite side of a PCB. The method also provides coupling variability for the power sensing element by altering either a suspended height or a length of a trace comprising an inductive coupling loop on a side of the PCB facing a housing.

What has been described above includes examples of the claimed subject matter. It is, of course, not possible to describe every conceivable combination of components or methodologies for purposes of describing the claimed subject matter, but one of ordinary skill in the art may recognize that many further combinations and permutations of the claimed subject matter are possible. Accordingly, the claimed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A power sensing coupler comprising:
a base;
a support component connected to the base;
a loop component extending from the support component; and
a tab component connected at one end to the support component by a connector inner conductor component and to the loop component by a terminating resistor.

2. The power sensing coupler of claim 1, wherein an opposing end of the tab component is non-conductively attached to the support component.

3. The power sensing coupler of claim 1, wherein the connector inner conductor component comprises a conductor terminating in an output.

4. The power sensing coupler of claim 1, wherein the loop component is an inductive coupling loop.

5. The power sensing coupler of claim 1, wherein the tab component is a capacitive tuning tab.

6. The directional power sensing coupler of claim 1, wherein the tab component is independent of the loop component so that the tab component picks up a capacitive field and the loop component picks up a magnetic field with minimal cross field contamination between them.

7. The power sensing coupler of claim 1, further comprising a second loop component extending from the support component and a second tab component connected to the support component by a second connector inner conductor component and to the second loop component by a second terminating resistor.

8. A directional power sensing coupler comprising:
a base;
a support component connected to the base;
a perimeter edge plate;
a printed circuit board (PCB) substrate attached to the perimeter edge plate; and
a first coupling component comprising a conductor penetrating the PCB substrate, a loop area formed within the PCB substrate, a capacitive tuning tab in electrical communication with the conductor, and a terminating resistor in electrical communication with the conductor.

9. The directional power sensing coupler of claim 8, wherein the loop area formed within the PCB substrate is located between the perimeter edge plate, the terminating resistor, and the conductor.

10. The directional power sensing coupler of claim 8, wherein the conductor terminates in an output.

11. The directional power sensing coupler of claim 8, wherein the capacitive tuning tab is capacitively coupleable to a high frequency transmission line.

12. The directional power sensing coupler of claim 8, further comprising a second coupling component located along the PCB substrate opposite to the first coupling component.

13. The directional power sensing coupler of claim 8, further comprising a sampling component located along the PCB substrate.

14. A directional power sensing coupler for use with a transmission line comprising:
a base;
a support component connected to the base;
a printed circuit board (PCB) substrate;
a gap comprising a loop area separating the PCB substrate from the support component; and
a forward coupling component comprising a conductor penetrating the gap and the PCB substrate, a capacitive tuning tab in electrical communication with the conductor, and a terminating resistor in electrical communication with the conductor.

15. The directional power sensing coupler of claim 14, further comprising a shield layer located between the loop area, the terminating resistor and the transmission line.

16. The directional power sensing coupler of claim 14, further comprising a reverse coupling component located along the PCB substrate opposite to the forward coupling component.

17. The directional power sensing coupler of claim 16, further comprising a sampling component located along the PCB substrate between the forward and reverse coupling components.

18. The directional power sensing coupler of claim 17, wherein the sampling component comprises a sampling component conductor penetrating the gap and the PCB substrate, a sampling component capacitive tuning tab in electrical communication with the sampling component conductor, and a conductive trace in electrical communication with the sampling component conductor.

19. The directional power sensing coupler of claim 17, wherein the forward coupling, reverse coupling, and sampling components are manufacturable in conjunction with the PCB substrate and support component substantially simultaneously.

20. The directional power sensing coupler of claim 14, further comprising a sampling component located along the PCB substrate.

21. The directional power sensing coupler of claim 14, wherein the gap enhances coupling and shielding of the loop area.

22. The directional power sensing coupler of claim 14, wherein the base, support component and PCB substrate traces provide a direct heat sink path to a ground allowing the use of higher power termination resistors to enhance power handling coupling capability from the main line.

23. The directional power sensing coupler of claim 14, wherein the directional power sensing coupler is manufacturable so that the PCB substrate thickness and the gap distance produce a consistent and repeatable coupling value.

* * * * *